United States Patent
Fukunaga et al.

(10) Patent No.: US 6,600,770 B2
(45) Date of Patent: Jul. 29, 2003

(54) HIGH-POWER SEMICONDUCTOR LASER DEVICE HAVING CURRENT CONFINEMENT STRUCTURE AND INDEX-GUIDED STRUCTURE AND STABLY OSCILLATING IN SINGLE MODE

(75) Inventors: Toshiaki Fukunaga, Kaisei-machi (JP); Mitsugu Wada, Kaisei-machi (JP); Kenji Matsumoto, Kaisei-machi (JP)

(73) Assignee: Fuji Photo Film Co., Ltd., Kanagawa-Ken (JP)

(*) Notice: Subject to any disclaimer, the term of this patent is extended or adjusted under 35 U.S.C. 154(b) by 0 days.

(21) Appl. No.: 09/838,339

(22) Filed: Apr. 20, 2001

(65) Prior Publication Data

US 2001/0033591 A1 Oct. 25, 2001

(30) Foreign Application Priority Data

Apr. 24, 2000 (JP) ........................................ 2000/122244

(51) Int. Cl.$^7$ ................................................. H01S 3/19
(52) U.S. Cl. ............................ 375/45; 375/46; 375/50
(58) Field of Search ............................... 372/45, 46, 50

(56) References Cited

U.S. PATENT DOCUMENTS

| | | | | |
|---|---|---|---|---|
| 5,825,796 A | * | 10/1998 | Jewell et al. | 372/45 |
| 5,982,799 A | * | 11/1999 | Bour et al. | 372/50 |
| 5,995,528 A | * | 11/1999 | Fukunaga et al. | 372/45 |
| 6,023,484 A | * | 2/2000 | Matsumoto et al. | 372/45 |
| 6,028,874 A | * | 2/2000 | Wada et al. | 372/45 |
| 6,127,691 A | * | 10/2000 | Fukunaga et al. | 372/45 |

OTHER PUBLICATIONS

Zhang et al., "Strain–compensated InGaAs/GaAsP/GaInAsP/GaInP quantum well lasers grown by gas–source molecular beam epitaxy" Apr. 5, 1993, Appl. Phys. Lett., 62pp 1644–1646.*, Bradley et al., "The effects of ion implantation on the interdiffusion coefficients in InGaAs/GaAs quantum well structures" Feb. 15, 1993, J. Appl. Phys., 73, pp 1686–1692.*

IEEE Journal of Selected Topics in Quantum Electronics, vol. 1, No. 2, 1995, pp. 102, 189.

IEEE Journal of Quantum Electronics, vol. 29, No. 6, 1993, pp. 1889, 1936.

* cited by examiner

*Primary Examiner*—Paul Ip
*Assistant Examiner*—Cornelius H. Jackson
(74) *Attorney, Agent, or Firm*—Sughrue Mion, PLLC

(57) ABSTRACT

In a semiconductor-laser device: an n-type cladding layer, an optical-waveguide layer, an $In_{x3}Ga_{1-x3}As_{1-y3}P_{y3}$ compressive-strain quantum-well active layer ($0<x3\leq0.4$, $0\leq y3\leq0.1$), an optical-waveguide layer, a $p\text{-}In_{x6}Ga_{1-x6}P$ etching-stop layer ($0\leq x6\leq1$), a $p\text{-}In_{x1}Ga_{1-x1}As_{1-y1}P_{y1}$ etching-stop layer ($0\leq x1\leq0.4$, $0\leq y1\leq0.5$), a $p\text{-}In_xGa_{1-x}P$ layer ($x=0.49\pm0.01$), and an $n\text{-}In_xGa_{1-x}P$ current-confinement layer are formed on an n-GaAs substrate. A stripe groove is formed down to the depth of the upper surface of the $p\text{-}In_{x6}Ga_{1-x6}P$ etching-stop layer. A $p\text{-}In_{x4}Ga_{1-x4}As_{1-y4}P_{y4}$ cladding layer ($x4=0.49y4\pm0.01$, $x-0.04\leq x4\leq x-0.01$) is formed over the current-confinement layer and the stripe groove. A p-type contact layer is formed on the $p\text{-}In_{x4}Ga_{1-x4}As_{1-y4}P_{y4}$ cladding layer. The absolute value of the product of the strain and the thickness of the active layer does not exceed 0.25 nm, and each of the above layers other than the active layer and the etching-stop layers lattice-matches with GaAs.

9 Claims, 2 Drawing Sheets

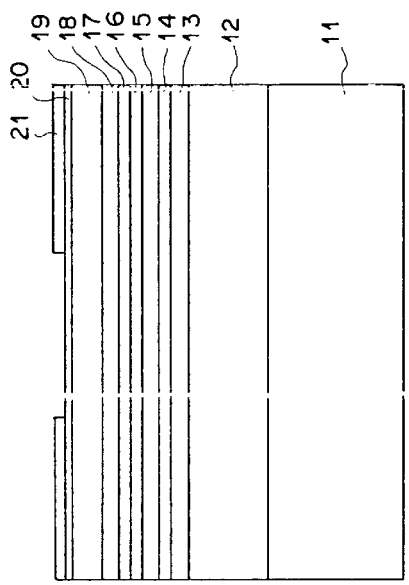
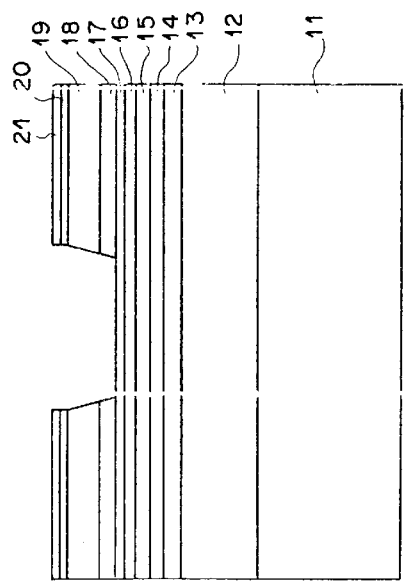
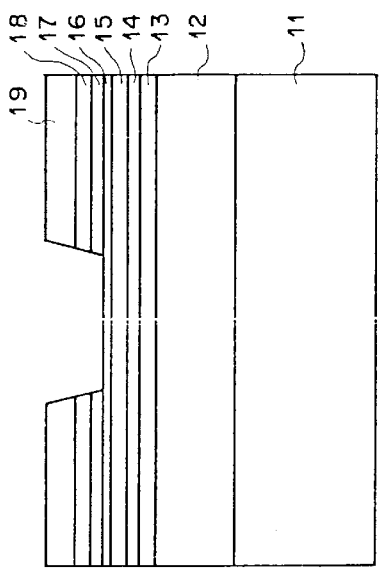
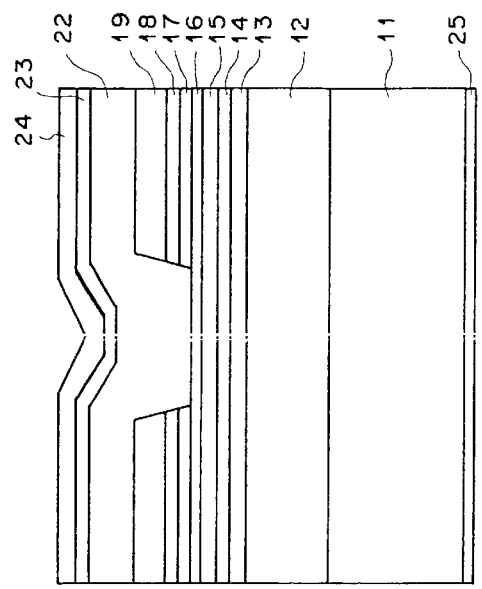

HIGH-POWER SEMICONDUCTOR LASER DEVICE HAVING CURRENT CONFINEMENT STRUCTURE AND INDEX-GUIDED STRUCTURE AND STABLY OSCILLATING IN SINGLE MODE

BACKGROUND OF THE INVENTION

1. Field of the Invention

The present invention relates to a semiconductor laser device having an internal current confinement structure and an index-guided structure.

2. Description of the Related Art (1) In many conventional current semiconductor laser devices which emit light in the 0.9 to 1.1 μm band, a current confinement structure and an index-guided structure are provided in crystal layers which constitute the semiconductor laser devices so that the semiconductor laser device oscillates in a fundamental transverse mode. For example, IEEE Journal of Selected Topics in Quantum Electronics, vol. 1, No. 2, 1995, pp. 102 discloses a semiconductor laser device which emits light in the 0.98 μm band. This semiconductor laser device is formed as follows.

On an n-type GaAs substrate, an n-type $Al_{0.48}Ga_{0.52}As$ lower cladding layer, an undoped $Al_{0.2}Ga_{0.8}As$ optical waveguide layer, an $Al_{0.2}Ga_{0.8}As/In_{0.2}Ga_{0.8}As$ double quantum well active layer, an undoped $Al_{0.2}Ga_{0.8}As$ optical waveguide layer, a p-type AlGaAs first upper cladding layer, a p-type $Al_{0.67}Ga_{0.33}As$ etching stop layer, a p-type $Al_{0.48}Ga_{0.52}As$ second upper cladding layer, a p-type GaAs cap layer, and an insulation film are formed in this order. Next, a narrow-stripe ridge structure is formed above the p-type $Al_{0.67}Ga_{0.33}As$ etching stop layer by the conventional photolithography and selective etching, and an n-type $Al_{0.7}Ga_{0.3}As$ and n-type GaAs materials are embedded in both sides of the ridge structure by selective MOCVD using Cl gas. Then, the insulation film is removed, and thereafter a p-type GaAs layer is formed. Thus, a current confinement structure and an index-guided structure are built in the semiconductor laser device.

However, the above semiconductor laser device has a drawback that it is very difficult to form the AlGaAs second upper cladding layer on the AlGaAs first upper cladding layer, since the AlGaAs first upper cladding layer contains a high Al content and is prone to oxidation, and selective growth of the AlGaAs second upper cladding layer is difficult.

(2) In addition, IEEE Journal of Selected Topics in Quantum Electronics, vol. 29, No. 6, 1993, pp. 1936 discloses a semiconductor laser device which oscillates in a fundamental transverse mode, and emits light in the 0.98 to 1.02 μm band. This semiconductor laser device is formed as follows.

On an n-type GaAs substrate, an n-type $Al_{0.4}Ga_{0.6}As$ lower cladding layer, an undoped $Al_{0.2}Ga_{0.8}As$ optical waveguide layer, a GaAs/InGaAs double quantum well active layer, an undoped $Al_{0.2}Ga_{0.8}As$ optical waveguide layer, a p-type $Al_{0.4}Ga_{0.6}As$ upper cladding layer, a p-type GaAs cap layer, and an insulation film are formed in this order. Next, a narrow-stripe ridge structure is formed above a mid-thickness of the p-type $Al_{0.4}Ga_{0.6}As$ upper cladding layer by the conventional photolithography and selective etching, and an n-type $In_{0.5}Ga_{0.5}P$ material and an n-type GaAs material are embedded in both sides of the ridge structure by selective MOCVD. Finally, the insulation film is removed, and then electrodes are formed. Thus, a current confinement structure and an index-guided structure are realized in the layered construction.

However, the above semiconductor laser device also has a drawback that it is very difficult to form the InGaP layer on the AlGaAs upper cladding layer, since the AlGaAs upper cladding layer contains a high Al content and is prone to oxidation, and it is difficult to grow an InGaP layer having different V-group component, on such an upper cladding layer.

(3) Further, IEEE Journal of Selected Topics in Quantum Electronics, vol. 1, No. 2, 1995, pp. 189 discloses an all-layer-Al-free semiconductor laser device which oscillates in a fundamental transverse mode, and emits light in the 0.98 μm band. This semiconductor laser device is formed as follows.

On an n-type GaAs substrate, an n-type InGaP cladding layer, an undoped InGaAsP optical waveguide layer, an InGaAsP tensile strain barrier layer, an InGaAs double quantum well active layer, an InGaAsP tensile strain barrier layer, an undoped InGaAsP optical waveguide layer, a p-type InGaP first upper cladding layer, a p-type GaAs optical waveguide layer, a p-type InGaP second upper cladding layer, a p-type GaAs cap layer, and an insulation film are formed in this order. Next, a narrow-stripe ridge structure is formed above the p-type InGaP first upper cladding layer by the conventional photolithography and selective etching, and an n-type $In_{0.5}Ga_{0.5}P$ material is embedded in both sides of the ridge structure by selective MOCVD. Finally, the insulation film is removed, and a p-type GaAs contact layer is formed. Thus, a current confinement structure and an index-guided structure are realized.

The reliability of the above semiconductor laser device is improved since the strain in the active layer can be compensated for. However, the above semiconductor laser device also has a drawback that the kink level is low (about 150 mW) due to poor controllability of the ridge width.

(4) Furthermore, IEEE Journal of Quantum Electronics, vol. 29, No. 6, 1993, pp. 1889–1894 discloses an internal striped structure semiconductor laser device which oscillates in a fundamental transverse mode, and emits light in the 0.8 μm band. This semiconductor laser device is formed as follows.

On an n-type GaAs substrate, an n-type AlGaAs lower cladding layer, an AlGaAs/GaAs triple quantum well active layer, a p-type AlGaAs first upper cladding layer, an n-type AlGaAs current confinement layer, and an n-type AlGaAs protection layer are formed in this order. Next, a narrow-stripe groove is formed, by the conventional photolithography and selective etching, to such a depth that the groove penetrates the n-type AlGaAs current confinement layer. Next, over the above structure, a p-type AlGaAs second upper cladding layer and a p-type GaAs contact layer are formed.

In the above semiconductor laser device, the stripe width can be controlled accurately, and high-output-power oscillation in a fundamental transverse mode can be realized by the difference in the refractive index between the n-type AlGaAs current confinement layer and the p-type AlGaAs second upper cladding layer. However, the above semiconductor laser device also has a drawback that it is difficult to form an AlGaAs layer on another AlGaAs layer since the AlGaAs layers are prone to oxidation.

As explained above, the conventional current semiconductor laser devices which contain an internal current confinement structure, and oscillate at a wavelength of 0.9 to 1.1 micrometers are not suitable for manufacturing and difficult to form a stripe structure with high accuracy. In addition, it is difficult to regrow upper layers after a current confinement layer is formed, when aluminum exists at the regrowth interface, since aluminum is prone to oxidation. Further, even when the upper layers are regrown, the regrowth interface is prone to defect formation. Therefore, the above conventional current semiconductor laser devices are not reliable.

SUMMARY OF THE INVENTION

An object of the present invention is to provide a reliable semiconductor laser device which can stably oscillate in an oscillation mode even when output power is high.

According to the present invention, there is provided a semiconductor laser device comprising: a GaAs substrate of a first conductive type; a lower cladding layer of the first conductive type, formed on the GaAs substrate; a lower optical waveguide layer formed on the lower cladding layer; a compressive strain quantum well active layer made of $In_{x3}Ga_{1-x3}As_{1-y3}P_{y3}$, and formed on the lower optical waveguide layer (where $0<x3\leq0.4$, and $0\leq y3\leq0.1$); an upper optical waveguide layer formed on the compressive strain quantum well active layer; a first etching stop layer made of $In_{x6}Ga_{1-x6}P$ of a second conductive type, and formed on the upper optical waveguide layer (where $0\leq x6\leq1$); a second etching stop layer made of $In_{x1}Ga_{1-x1}As_{1-y1}P_{y1}$ of the second conductive type, and formed on the first etching stop layer other than a stripe area of the first etching stop layer so as to form a first portion of a stripe groove realizing a current injection window (where $0\leq x1\leq0.4$, and $0\leq y1\leq0.5$); a first $In_xGa_{1-x}P$ layer of the second conductive type, and formed on the second etching stop layer so as to form a second portion of the stripe groove (where $x-0.49\pm0.01$); a current confinement layer made of $In_xGa_{1-x}P$ of the first conductive type, and formed on the first $In_xGa_{1-x}P$ layer so as to form a third portion of the stripe groove; an upper cladding layer made of $In_{x4}Ga_{1-x4}As_{1-y4}P_{y4}$ of the second conductive type, and formed over the current confinement layer and the stripe groove (where $x4=0.49y4\pm0.01$, and $x-0.04\leq x4\leq x-0.01$); and a contact layer of the second conductive type, formed on the upper cladding layer. In the above semiconductor laser device, the absolute value of the product of the strain and the thickness of the compressive strain quantum well active layer is equal to or smaller than 0.25 nm, and each of layers constituting the semiconductor laser device other than the compressive strain quantum well active layer and the first and second etching stop layers has such a composition as to lattice-match with GaAs.

The first conductive type is different in carrier polarity from the second conductive type. That is, when the first conductive type is n type, and the second conductive type is p type.

The strain of a layer grown above the GaAs substrate is defined as $(c-c_s)/c_s$, where $c_s$ and $c$ are the lattice constants of the GaAs substrate and the layer grown above the GaAs substrate, respectively. When the absolute value of the amount $(c-c_s)/c_s$ is equal to or smaller than 0.003, the layer grown above the GaAs substrate is lattice-matched with the GaAs substrate.

Preferably, the semiconductor laser device according to the present invention may also have one or any possible combination of the following additional features (i) to (iii).

(i) The semiconductor laser device may further include at least one tensile strain barrier layer made of $In_{x5}Ga_{1-x5}As_{1-y5}P_{y5}$ and formed adjacent to the compressive strain quantum well active layer, where $0\leq x5\leq0.3$ and $0<y5\leq0.6$. In this case, it is further preferable that the absolute value of a sum of the above product of the strain and the thickness of the compressive strain quantum well active layer and another product of the strain of the at least one tensile strain barrier layer and a total thickness of the at least one tensile strain barrier layer is equal to or smaller than 0.25 nm.

(ii) Each of the lower and upper optical waveguide layers may be one of an undoped type and the first and second conductive types. Layers of the undoped type are not doped with an impurity which produces carriers of a conductive type in the layers.

(iii) The semiconductor laser device may further include a second $In_xGa_{1-x}P$ layer of the second conductive type having a thickness of 30 nm or smaller and being formed under the $In_{x4}Ga_{1-x4}As_{1-y4}P_{y4}$ upper cladding layer of the second conductive type so that the second $In_xGa_{1-x}P$ layer of the second-conductive type covers the first-conductive type $In_xGa_{1-x}P$ current confinement layer and the stripe groove.

The semiconductor laser devices according to the present invention have the following advantages.

(a) The semiconductor laser device according to the present invention can stably oscillate in a fundamental transverse mode even when output power is increased to a high level.

(b) In the semiconductor laser device according to the present invention, the current confinement layer is made of $In_xGa_{1-x}P$, and the upper cladding layer is made of $In_{x4}Ga_{1-x4}As_{1-y4}P_{y4}$ of the second conductive type (where $x4=0.49y4\pm0.01$, and $x-0.04\leq x4\leq x-0.01$). Therefore, the difference in the refractive index between the current confinement layer and the upper cladding layer realizes a difference of about $2\times10^{-3}$ to $7\times10^{-3}$ in the equivalent refractive index of the active layer between the portion under the current confinement layer and the portion under the stripe groove, with high accuracy, and it is possible to cut off oscillation in higher modes. Thus, stable oscillation in a fundamental transverse mode can be maintained even when the output power is increased to a high level. That is, the reliability of the semiconductor laser device is increased by the present invention.

(c) Since the semiconductor laser device includes an internal current confinement structure, it is possible to increase the contact area between the electrode and the contact layer. Therefore, the contact resistance can be reduced.

(d) The first etching stop layer is made of $In_{x6}Ga_{1-x6}P$ ($0\leq x6\leq1$), and the second etching stop layer made of $In_{x1}Ga_{1-x1}As_{1-y1}P_{y1}$ ($0\leq x1\leq0.4$ and $0\leq y1\leq0.5$) is formed on the first etching stop layer. Therefore, when a sulfuric acid etchant is used, only the $In_{x1}Ga_{1-x1}As_{1-y1}P_{y1}$ second etching stop layer is etched, and the $In_{x6}Ga_{1-x6}P$ first etching stop layer is not etched. That is, it is possible to accurately stop etching on the upper surface of the first etching stop layer, and thus the stripe width can be accurately controlled by wet etching.

(e) Since aluminum does not exist at the regrowth interface, it is easy to regrow the upper cladding layer. In addition, since no crystal defect occurs due to oxidation of aluminum, the characteristics of the semiconductor laser device do not deteriorate.

(f) When the compressive strain quantum well active layer is sandwiched between the $In_{x5}Ga_{1-x5}As_{1-y5}P_{y5}$ tensile strain barrier layers (where $0 \leq x5 \leq 0.3$ and $0 < y5 \leq 0.6$), the compressive strain in the quantum well active layer can be compensated for by the tensile strain in the tensile strain barrier layers. Therefore, characteristics of the semiconductor laser device are improved (e.g., the threshold current is lowered), and reliability is increased.

(g) Since the second-conductive type first $In_xGa_{1-x}P$ layer is formed under the first-conductive type $In_xGa_{1-x}P$ current confinement layer, the difference in the band gap between the second-conductive type $In_{x4}Ga_{1-x4}As_{1-y4}P_{y4}$ upper cladding layer and the layers on both sides of the stripe groove can be increased. Therefore, the spread of the current injected into the semiconductor laser device can be effectively restricted.

(h) When the second-conductive type second $In_xGa_{1-x}P$ layer is formed under the second-conductive type $In_{x4}Ga_{1-x4}As_{1-y4}P_{y4}$ upper cladding layer (x4= 0.49y4±0.01 and x−0.04≤x4≤x−0.01) so that the second-conductive type second $In_xGa_{1-x}P$ layer covers the first-conductive type $In_xGa_{1-x}P$ current confinement layer and the stripe groove, the semiconductor laser device has similar advantages to the semiconductor laser devices described above.

DESCRIPTION OF THE DRAWINGS

FIGS. 1A to 1D are cross-sectional views of representative stages in a process for producing a semiconductor laser device as a first embodiment.

DESCRIPTION OF PREFERRED EMBODIMENTS

Figure 2:
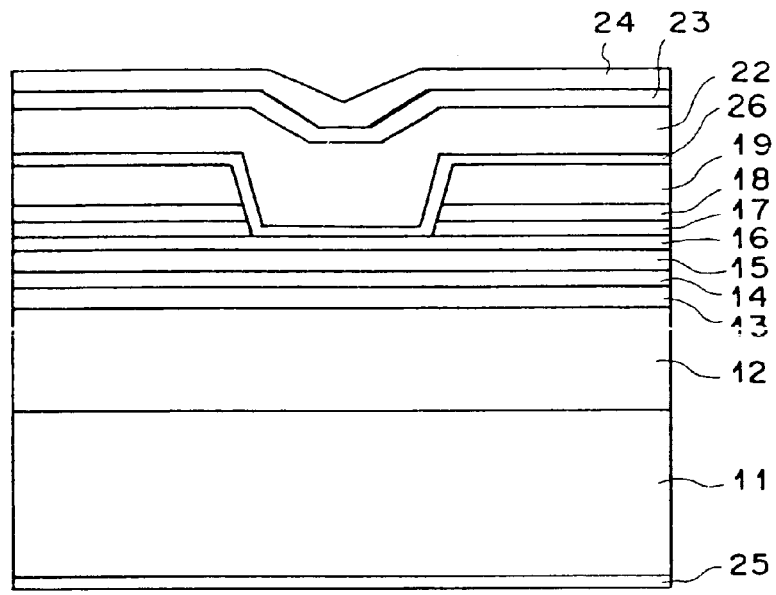
FIG. 2 is a cross-sectional view of a semiconductor laser device as a variation of the first embodiment.

Embodiments of the present invention are explained in detail below with reference to drawings.

First Embodiment

FIGS. 1A to 1D show cross sections of the representative stages in the process for producing a semiconductor laser device as the first embodiment.

First, as illustrated in FIG. 1A, an n-type $In_xGa_{1-x}P$ lower cladding layer 12 (x=0.49±0.01), an n-type or i-type (intrinsic) $In_{x2}Ga_{1-x2}As_{1-y2}P_{y2}$ lower optical waveguide layer 13 (x2=0.49y2±0.01, $0 \leq x2 \leq 0.3$), an $In_{x3}Ga_{1-x3}As_{1-y3}P_{y3}$ compressive strain quantum well active layer 14 (0<x3≤0.4, 0≤y3≤0.1), a p-type or i-type $In_{x2}Ga_{1-x2}As_{1-y2}P_{y2}$ upper optical waveguide layer 15 (x2= 0.49y2±0.01, $0 \leq x2 \leq 0.3$), a p-type $In_{x6}Ga_{1-x6}P$ first etching stop layer 16 ($0 \leq x6 \leq 1$), a p-type $In_{x1}Ga_{1-x1}As_{1-y1}P_{y1}$ second etching stop layer 17 ($0 \leq x1 \leq 0.4$, $0 \leq y1 \leq 0.5$) having a thickness of 20 nm, a p-type $In_xGa_{1-x}P$ layer 18 having a thickness of about 100 nm, an n-type $In_xGa_{1-x}P$ current confinement layer 19 having a thickness of about 1 micrometer, and an n-type GaAs cap layer 20 having a thickness of about 10 nm are formed on an n-type GaAs substrate 11 by organometallic vapor phase epitaxy. Then, a $SiO_2$ film 21 is formed over the n-type GaAs cap layer 20, and a stripe area of the $SiO_2$ film 21 having a width of about 1 to 3 μm and extending in the <011> direction is removed by conventional photolithography, so that a stripe area of the n-type GaAs cap layer 20 is exposed.

Next, as illustrated in FIG. 1B, the stripe area of the n-type GaAs cap layer 20 and stripe areas of the n-type $In_xGa_{1-x}P$ current confinement layer 19 and the p-type $In_xGa_{1-x}P$ layer 18 are etched off with a sulfuric acid etchant by using the $SiO_2$ film 21 as a mask, until a stripe area of the p-type $In_{x1}Ga_{1-x1}As_{1-y1}P_{y1}$ second etching stop layer 17 is exposed.

Thereafter, as illustrated in FIG. 1C, the remaining areas of the $SiO_2$ film 21 are removed by a fluoric acid etchant. Then, the remaining areas of the n-type GaAs cap layer 20 and the exposed stripe area of the p-type $In_{x1}Ga_{1-x1}As_{1-y1}P_{y1}$ second etching stop layer 17 are removed by etching with a sulfuric acid etchant.

Finally, as illustrated in FIG. 1D, a p-type $In_{x4}Ga_{1-x4}As_{1-y4}P_{y4}$ upper cladding layer 22 (x4= 0.49y4±0.01, x−0.04≤x4≤x−0.01) and a p-type GaAs contact layer 23 are formed over the construction of FIG. 1C. Then, a p electrode 24 is formed on the p-type GaAs contact layer 23. In addition, the exposed surface of the substrate 11 is polished, and an n electrode 25 is formed on the polished surface of the substrate 11. Next, both end facets of the layered construction are cleaved, and a high reflectance coating and a low reflectance coating are provided on the respective end facets so as to form a resonator. Then, the above construction is formed into a chip of a semiconductor laser device.

In the above construction, the p-type or i-type $In_{x2}Ga_{1-x2}As_{1-y2}P_{y2}$ upper optical waveguide layer 15 has such a thickness that oscillation in a fundamental transverse mode can be maintained even when output power becomes high. That is, the semiconductor laser device as the first embodiment can operate in the fundamental transverse mode even when output power becomes high, and the reliability of the semiconductor laser device as the first embodiment is high.

FIG. 2 is a cross-sectional view of a semiconductor laser device as a variation of the first embodiment. As illustrated in FIG. 2, another p-type $In_xGa_{1-x}P$ layer 26 having a thickness of about 10 nm can be formed under the p-type $In_{x4}Ga_{1-x4}As_{1-y4}P_{y4}$ upper cladding layer 22 in the construction of the first embodiment.

Second Embodiment

Figure 3:
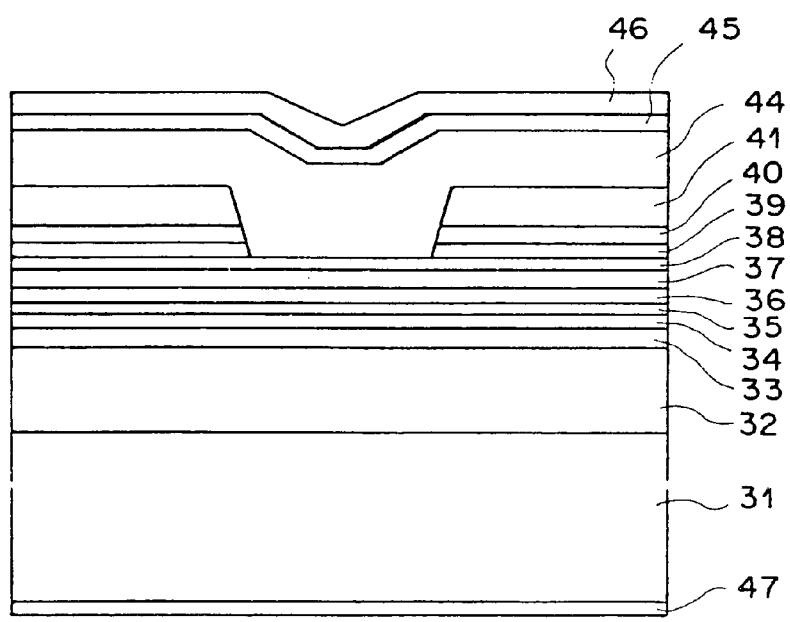
FIG. 3 is a cross-sectional view of a semiconductor laser device as a second embodiment.

FIG. 3 is a cross-sectional view of a semiconductor laser device as a second embodiment.

First, as illustrated in FIG. 2, an n-type $In_xGa_{1-x}P$ lower cladding layer 32 (x=0.49±0.01), an n-type or i-type (intrinsic) $In_{x2}Ga_{1-x2}As_{1-y2}P_{y2}$ lower optical waveguide layer 33 (x2=(0.49±0.01)y2, $0 \leq x2 \leq 0.3$), an $In_{x5}Ga_{1-x5}As_{1-y5}P_{y5}$ tensile strain barrier layer 34 ($0 \leq x5 \leq 0.3$, $0 \leq y5 \leq 0.6$), an $In_{x3}Ga_{1-x3}As_{1-y3}P_{y3}$ compressive strain quantum well active layer 35 (0<x3≤0.4, 0≤y3≤0.1), an $In_{x5}Ga_{1-x5}As_{1-y5}P_{y5}$ tensile strain barrier layer 36 ($0 \leq x5 \leq 0.3$, $0 \leq y5 \leq 0.6$), a p-type or i-type $In_{x2}Ga_{1-x2}As_{1-y2}P_{y2}$ upper optical waveguide layer 37 (x2= (0.49±0.01)y2, $0 \leq x2 \leq 0.3$), a p-type $In_{x6}Ga_{1-x6}P$ first etching stop layer 38 ($O \leq x6 \leq 1$), a p-type $In_{x1}Ga_{1-x1}As_{1-y1}P_{y1}$ second etching stop layer 39 ($0 \leq x1 \leq 0.4$, $0 \leq y1 \leq 0.5$), a p-type $In_xGa_{1-x}P$ layer 40 having a thickness of about 100 nm, an n-type $In_xGa_{1-x}P$ current confinement layer 41 having a thickness of about 1 micrometer, and an n-type GaAs cap layer 42 (not shown) are formed on an n-type GaAs substrate 31 by organometallic vapor phase epitaxy. Then, a $SiO_2$ film 43 (not shown) is formed over the n-type GaAs cap layer 42, and a stripe area of the $SiO_2$ film 43 having a width of about 1 to 3 μm and extending in the <011> direction is removed by conventional photolithography, so that a stripe area of the n-type GaAs cap layer 42 is exposed.

Next, the exposed stripe area of the n-type GaAs cap layer 42 is etched off with a sulfuric acid etchant by using the $SiO_2$ film 43 as a mask until a stripe area of the n-type $In_xGa_{1-x}P$ current confinement layer 41 is exposed. Then, the exposed stripe area of the n-type $In_xGa_{1-x}P$ current confinement layer 41 and a stripe area of the p-type $In_xGa_{1-x}P$ layer 40 are etched off with a hydrochloric acid etchant until a stripe area of the p-type $In_{x1}Ga_{1-x1}As_{1-y1}P_{y1}$ second etching stop layer 39 is exposed.

Thereafter, the remaining areas of the $SiO_2$ film 43 are removed by a fluoric acid etchant. Then, the remaining areas of the n-type GaAs cap layer 42 and the exposed stripe area of the p-type $In_{x1}Ga_{1-x1}As_{1-y1}P_{y1}$ second etching stop layer 39 are removed by etching with a sulfuric acid etchant.

Finally, a p-type $In_{x4}Ga_{1-x4}As_{1-y4}P_{y4}$ upper cladding layer 44 ($x4=0.49y4\pm0.01$, $x-0.04 \leq x4 \leq x-0.01$) and a p-type GaAs contact layer 45 are formed as illustrated in FIG. 3. Then, a p electrode 46 is formed on the p-type GaAs contact layer 45. In addition, the exposed surface of the substrate 31 is polished, and an n electrode 47 is formed on the polished surface of the substrate 31. Next, both end facets of the layered construction are cleaved, and a high reflectance coating and a low reflectance coating are provided on the respective end facets so as to form a resonator. Then, the above construction is formed into a chip of a semiconductor laser device.

In the above construction, the p-type or i-type $In_{x2}Ga_{1-x2}As_{1-y2}P_{y2}$ upper optical waveguide layer 37 has such a thickness that oscillation in a fundamental transverse mode can be maintained even when output power becomes high. That is, the semiconductor laser device as the second embodiment can operate in the fundamental transverse mode even when output power becomes high, and the reliability of the semiconductor laser device as the second embodiment is high.

Since the compressive strain quantum well active layer is sandwiched between the $In_{x5}Ga_{1-x5}As_{1-y5}P_{y5}$ tensile strain barrier layers, compared with the first embodiment, characteristics of the semiconductor laser device as the second embodiment are improved (e.g., the threshold current is lowered), and reliability is increased.

In the construction of the second embodiment, similar to the construction of FIG. 2, another p-type $In_xGa_{1-x}P$ layer having a thickness of about 10 nm can also be formed under the p-type $In_{x4}Ga_{1-x4}As_{1-y4}P_{y4}$ upper cladding layer 44 ($x4=(0.49\pm0.01)y4$, $x-0.04 \leq x4 \leq x-0.01$).

Additional Matters to Embodiments (i) Due to the $In_{x3}Ga_{1-x3}As_{1-y3}P_{y3}$ compressive strain quantum well active layers ($0<x3 \leq 0.4$, $0 \leq y3 \leq 0.1$), the oscillation wavelengths of the semiconductor laser devices as the first and second embodiments can be controlled in the range of 900 to 1,200 nm.

(ii) Each layer in the constructions of the first and second embodiments may be formed by molecular beam epitaxy using solid or gas raw material.

(iii) Although n-type GaAs substrates are used in the constructions of the first and second embodiments, instead, p-type GaAs substrates may be used. When the GaAs substrates are p-type, the conductivity types of all of the other layers in the constructions of the first and second embodiments should be inverted.

(iv) The constructions of the first and second embodiments are index-guided semiconductor laser devices which oscillate in a single fundamental transverse mode. However, index-guided semiconductor laser devices which oscillate in multiple modes can be produced when the stripe widths in the constructions of the first and second embodiments are increased to 3 micrometers or more.

(v) The constructions of the first and second embodiments can be used not only in index-guided semiconductor laser devices, but also in semiconductor laser devices having a diffraction lattice. Further, the constructions of the first and second embodiments can be used in optical integrated circuits.

(vi) When the GaAs cap layer is formed on the InGaP current confinement layer, it is possible to prevent formation of a natural oxidation film on the InGaP current confinement layer, as well as metamorphic change in the InGaP current confinement layer which occurs when a resist layer is formed directly on the InGaP current confinement layer. In addition, since the GaAs cap layer is removed before the upper optical waveguide layer is formed, it is possible to remove a residue left on the base layer on which the upper optical waveguide layer is formed, and prevent the occurrence of crystal defects.

(vii) In the constructions of the semiconductor laser devices as the first and second embodiments, the n-type GaAs cap layer 20 or 42 can be replaced with a p-type GaAs cap layer. Alternatively, the n-type GaAs cap layer can be dispensed with.

(viii) Since the semiconductor laser devices according to the present invention can stably oscillate even when the output power is increased, the semiconductor laser devices according to the present invention can be used as a light source in the fields of high-speed, information processing, image processing, communications, laser measurement, medicine, printing, and the like.

What is claimed is:

1. A semiconductor laser device comprising:
  a GaAs substrate of a first conductive type;
  a lower cladding layer of said first conductive type, formed on said GaAs substrate;
  a lower optical waveguide layer formed on said lower cladding layer;
  a compressive strain quantum well active layer made of $In_{x3}Ga_{1-x3}As_{1-y3}P_{y3}$, and formed on said lower optical waveguide layer, where $0<x3 \leq 0.4$, $0 \leq y3 \leq 0.1$, and an absolute value of a product of a strain and a thickness of said compressive strain quantum well active layer is equal to or smaller than 0.25 nm;
  an upper optical waveguide layer formed on said compressive strain quantum well active layer;
  a first etching stop layer made of $In_{x6}Ga_{1-x6}P$ of a second conductive type, and formed on said upper optical waveguide layer, where $0 \leq x6 \leq 1$;
  a second etching stop layer made of $In_{x1}Ga_{1-x1}As_{1-y1}P_{y1}$ of said second conductive type, and formed on said first etching stop layer other than a stripe area of said first etching stop layer so as to form a first portion of a stripe groove realizing a current injection window, where $0 \leq x1 \leq 0.4$, and $0 \leq y1 \leq 0.5$;
  a first $In_xGa_{1-x}P$ layer of said second conductive type, and formed on said second etching stop layer so as to form a second portion of said stripe groove, where $x=0.49\pm0.01$;
  a current confinement layer made of $In_xGa_{1-x}P$ of said first conductive type, and formed on said first $In_xGa_{1-x}P$ layer so as to form a third portion of said stripe groove;
  an upper cladding layer made of $In_{x4}Ga_{1-x4}As_{1-y4}P_{y4}$ of said second conductive type, and formed over said current confinement layer and said stripe groove, where $x4=0.49y4\pm0.01$, and $x-0.04 \leq x4 \leq x-0.01$; and a contact layer of said second conductive type, formed on said upper cladding layer;

wherein each of layers constituting said semiconductor laser device other than the compressive strain quantum well active layer and the first and second etching stop layers has such a composition as to lattice-match with GaAs.

2. A semiconductor laser device according to claim 1, further comprising at least one tensile strain barrier layer made of $In_{x5}Ga_{1-x5}As_{1-y5}P_{y5}$ and formed adjacent to said compressive strain quantum well active layer, where $0 \leq x5 \leq 0.3$, and $0 < y5 \leq 0.6$.

3. A semiconductor laser device according to claim 1, wherein each of said lower and upper optical waveguide layers is one of an undoped type and said first and second conductive types.

4. A semiconductor laser device according to claim 1, further comprising a second $In_xGa_{1-x}P$ layer of said second conductive type having a thickness of 30 nm or smaller and being formed under said second-conductive type $In_{x4}Ga_{1-x4}As_{1-y4}P_{y4}$ upper cladding layer so that the second $In_xGa_{1-x}P$ layer covers the $In_xGa_{1-x}P$ current confinement layer and said stripe groove.

5. A semiconductor laser device according to claim 1, wherein a difference in refractive index between the current confinement layer and the upper cladding layer is $2\times10^{-3}$ to $7\times10^{-3}$ in an equivalent refractive index of the active layer between a portion under the current confinement layer and a portion under the stripe groove.

6. A semiconductor laser device comprising:

a substrate of a first conductive type;

a first cladding layer formed on the substrate;

a first optical waveguide layer formed on the first cladding layer;

a compressive strain quantum well active layer comprising $In_{x3}Ga_{1-x3}As_{1-y3}P_{y3}$, where $(0<x3 \leq 0.4, 0 \leq y3 \leq 0.1)$, and formed on the first optical waveguide layer; wherein an absolute value of a product of strain and a thickness of said compressive strain quantum well active layer is equal to or smaller than 0.25 nm;

a second optical waveguide layer formed on the compressive strain quantum well active layer; and a second cladding layer formed above the second optical waveguide layer.

7. A semiconductor laser device according to claim 6, further comprising a first tensile strain barrier in physical contact with said compressive strain quantum well active layer, said tensile strain barrier comprising $In_{x5}Ga_{1-x5}As_{1-y5}P_{y5}$, where $0 \leq x5 \leq 0.3$ and $0 \leq y5 \leq 0.6$.

8. The semiconductor laser device according to claim 7, wherein an absolute value of a sum of a product of the strain and the thickness of the compressive strain quantum well active layer and a product of the strain of the tensile strain barrier layer and a total thickness of the tensile strain barrier layer is equal to or smaller than 0.25 nm.

9. A semiconductor laser device according to claim 6 further comprising first and second conductive InGaP layers, wherein the second cladding layer is disposed over said second conductive InGaP layer to be in physical contact with said second conductive InGaP layer, said second conductive InGaP layer having a thickness greater than 0 and less than 30 nm, each of first and second InGaP conductive layer disposed over said compressive strain quantum well active layer.

* * * * *